United States Patent
Tu et al.

(10) Patent No.: US 8,222,066 B2
(45) Date of Patent: Jul. 17, 2012

(54) ELIMINATE RELEASE ETCH ATTACK BY INTERFACE MODIFICATION IN SACRIFICIAL LAYERS

(75) Inventors: Thanh Nghia Tu, San Jose, CA (US); Qi Luo, San Jose, CA (US); Chia Wei Yang, Hsinchu (TW); David Heald, Solvang, CA (US); Evgeni Gousev, Saratoga, CA (US); Chih-Wei Chiang, Hsin-Chu (TW)

(73) Assignee: Qualcomm Mems Technologies, Inc., San Diego, CA (US)

( * ) Notice: Subject to any disclaimer, the term of this patent is extended or adjusted under 35 U.S.C. 154(b) by 566 days.

(21) Appl. No.: 12/061,592

(22) Filed: Apr. 2, 2008

(65) Prior Publication Data

US 2008/0311690 A1    Dec. 18, 2008

Related U.S. Application Data

(60) Provisional application No. 60/910,184, filed on Apr. 4, 2007.

(51) Int. Cl.
   *H01L 21/00*   (2006.01)
(52) U.S. Cl. .......................... 438/52; 438/29; 257/E21.5
(58) Field of Classification Search .............. 438/52, 438/29; 257/E21.05
   See application file for complete search history.

(56) References Cited

U.S. PATENT DOCUMENTS

| | | |
|---|---|---|
| 5,061,049 A | 10/1991 | Hornbeck |
| 5,096,279 A | 3/1992 | Hornbeck et al. |
| 5,312,512 A | 5/1994 | Allman et al. |
| 5,331,454 A | 7/1994 | Hornbeck |
| 5,411,769 A | 5/1995 | Hornbeck |
| 5,459,610 A | 10/1995 | Bloom et al. |
| 5,578,976 A | 11/1996 | Yao |
| 5,602,671 A | 2/1997 | Hornbeck |
| 5,610,438 A | 3/1997 | Wallace et al. |
| 5,665,997 A | 9/1997 | Weaver et al. |
| 5,783,864 A | 7/1998 | Dawson et al. |
| 5,824,608 A | 10/1998 | Gotoh et al. |
| 5,919,548 A | 7/1999 | Barron et al. |
| 5,978,127 A | 11/1999 | Berg |

(Continued)

FOREIGN PATENT DOCUMENTS

CH   680534   9/1992

(Continued)

OTHER PUBLICATIONS

International Search Report and the Written Opinion mailed on Dec. 12, 2008 in the corresponding PCT Application No. PCT/Us2008/058956.

(Continued)

*Primary Examiner* — Matthew Reames
*Assistant Examiner* — Elias M Ullah
(74) *Attorney, Agent, or Firm* — Knobbe, Martens, Olson & Bear, LLP

(57) ABSTRACT

Methods of making a microelectromechanical system (MEMS) device are described. In some embodiments, the method includes forming a sacrificial layer over a substrate, treating at least a portion of the sacrificial layer to form a treated sacrificial portion, forming an overlying layer over at least a part of the treated sacrificial portion, and at least partially removing the treated sacrificial portion to form a cavity situated between the substrate and the overlying layer, the overlying layer being exposed to the cavity.

32 Claims, 12 Drawing Sheets

U.S. PATENT DOCUMENTS

| | | | |
|---|---|---|---|
| 5,998,293 | A | 12/1999 | Dawson et al. |
| 6,033,919 | A | 3/2000 | Gnade et al. |
| 6,040,937 | A | 3/2000 | Miles |
| 6,046,840 | A | 4/2000 | Huibers |
| 6,099,132 | A | 8/2000 | Kaeriyama |
| 6,172,797 | B1 | 1/2001 | Huibers |
| 6,324,192 | B1 | 11/2001 | Tayebati |
| 6,379,988 | B1 | 4/2002 | Peterson et al. |
| 6,448,622 | B1 | 9/2002 | Franke et al. |
| 6,597,490 | B2 | 7/2003 | Tayebati |
| 6,608,268 | B1 | 8/2003 | Goldsmith |
| 6,624,944 | B1 | 9/2003 | Wallace et al. |
| 6,635,919 | B1 | 10/2003 | Melendez et al. |
| 6,670,274 | B1 | 12/2003 | Liu et al. |
| 6,674,562 | B1 | 1/2004 | Miles |
| 6,710,908 | B2 | 3/2004 | Miles et al. |
| 6,787,968 | B2 | 9/2004 | Tai et al. |
| 6,791,441 | B2 | 9/2004 | Pillans et al. |
| 6,815,361 | B1 | 11/2004 | Bae et al. |
| 6,858,080 | B2 | 2/2005 | Linares et al. |
| 6,905,970 | B2 | 6/2005 | Shing et al. |
| 6,969,635 | B2 | 11/2005 | Patel et al. |
| 6,991,995 | B2 | 1/2006 | Aulnette et al. |
| 7,002,441 | B2 | 2/2006 | Pillans et al. |
| 7,123,216 | B1 | 10/2006 | Miles |
| 7,190,038 | B2 | 3/2007 | Dehe et al. |
| 7,190,245 | B2 | 3/2007 | Receveur et al. |
| 7,195,343 | B2 | 3/2007 | Anderson et al. |
| 7,327,510 | B2 | 2/2008 | Cummings et al. |
| 7,527,995 | B2 | 5/2009 | Sampsell et al. |
| 7,616,370 | B2 | 11/2009 | Chen et al. |
| 2003/0104752 | A1 | 6/2003 | Lee et al. |
| 2003/0138986 | A1* | 7/2003 | Bruner .................... 438/52 |
| 2003/0164350 | A1 | 9/2003 | Hanson et al. |
| 2003/0231373 | A1 | 12/2003 | Kowarz et al. |
| 2004/0033372 | A1 | 2/2004 | Mueller et al. |
| 2004/0051929 | A1 | 3/2004 | Sampsell et al. |
| 2004/0100677 | A1 | 5/2004 | Huibers et al. |
| 2004/0150939 | A1 | 8/2004 | Huff |
| 2004/0188785 | A1 | 9/2004 | Cunningham et al. |
| 2004/0217919 | A1 | 11/2004 | Pichl et al. |
| 2005/0001274 | A1 | 1/2005 | Kim et al. |
| 2005/0012577 | A1 | 1/2005 | Pillans et al. |
| 2005/0012975 | A1 | 1/2005 | George et al. |
| 2005/0042117 | A1* | 2/2005 | Lin ........................ 417/413.3 |
| 2005/0078348 | A1 | 4/2005 | Lin |
| 2006/0024620 | A1 | 2/2006 | Nikkel et al. |
| 2006/0024880 | A1 | 2/2006 | Chui et al. |
| 2006/0066871 | A1* | 3/2006 | Cummings et al. ......... 356/503 |
| 2006/0066932 | A1* | 3/2006 | Chui et al. .................. 359/247 |
| 2006/0066935 | A1* | 3/2006 | Cummings et al. ......... 359/291 |
| 2006/0076311 | A1 | 4/2006 | Tung et al. |
| 2006/0077518 | A1 | 4/2006 | Chui et al. |
| 2006/0097823 | A1 | 5/2006 | Fujii et al. |
| 2006/0113618 | A1 | 6/2006 | Reboa |
| 2006/0170012 | A1 | 8/2006 | Larmer et al. |
| 2006/0186759 | A1 | 8/2006 | Kim et al. |
| 2007/0019922 | A1 | 1/2007 | Sasagawa et al. |
| 2007/0020794 | A1 | 1/2007 | DeBar |
| 2007/0026636 | A1 | 2/2007 | Gogoi |
| 2007/0247696 | A1 | 10/2007 | Sasagawa et al. |
| 2007/0254405 | A1* | 11/2007 | Chen et al. .................. 438/109 |
| 2008/0108163 | A1 | 5/2008 | Chen et al. |
| 2008/0218843 | A1 | 9/2008 | Sasagawa et al. |

FOREIGN PATENT DOCUMENTS

| | | |
|---|---|---|
| EP | 0 578 228 A2 | 1/1994 |
| EP | 0 578 228 A3 | 1/1994 |
| EP | 0 578 228 B1 | 1/1994 |
| EP | 0 747 684 | 12/1996 |
| EP | 1 209 738 A2 | 5/2002 |
| EP | 1 209 738 A3 | 2/2004 |
| EP | 1 493 711 | 1/2005 |
| EP | 1 640 317 | 3/2006 |
| FR | 2 839 919 | 11/2003 |
| JP | 06301054 | 10/1994 |
| JP | 08293580 | 11/1996 |
| JP | 11-263012 | 9/1999 |
| JP | 11-209008 | 10/1999 |
| JP | 2000-075223 | 3/2000 |
| JP | 2002-355800 | 12/2002 |
| JP | 2003-021798 | 1/2003 |
| JP | 2003-181976 | 7/2003 |
| JP | 2003-195189 | 7/2003 |
| JP | 2006-228835 | 8/2006 |
| KR | 9410912 | 11/1994 |
| WO | WO 03/031319 | 4/2003 |
| WO | WO 03/046508 | 6/2003 |
| WO | WO 2004/000717 | 12/2003 |
| WO | WO 2004/075231 | 9/2004 |
| WO | WO 2004/096696 | 11/2004 |
| WO | WO 2005/124869 | 12/2005 |
| WO | WO 2007/013939 | 2/2007 |
| WO | WO 2007/022476 | 2/2007 |
| WO | WO 2007/022476 A1 | 2/2007 |
| WO | WO 2007/060416 | 5/2007 |

OTHER PUBLICATIONS

Maboudian, et al., Self-assembled monolayers as anti-stiction coatings for MEMS: characteristics and recent developments, Sensors and Actuators 82, pp. 219-223, 2000.

ISR and WO for PCT/US08/058956, filed Mar. 31, 2008.

Maboudian, et al. Critical Review: Adhesion in Surface Micromechanical Structures: J. Vac. Sci Techno. B 15(1) Jan./Feb. 1997, pp. 1-20.

Matsumoto et al., Novel prevention method of stiction using silicon anodization for SOI structure, Sensors and Actuators, 72:2(153-159) Jan. 19, 1999.

Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).

Xactix Xetch X# Specifications, http:--www.xactix.com-Xtech X3specs.htm, Jan. 5, 2005.

Xactix Xetch Product Information.

IPRP for PCT/US08/058956, filed Mar. 31, 2008.

Australian Patent Office International-Type Search Report, dated Aug. 14, 2007.

Livingston, Ian P. "Fabrication of an integrated surface microelectromechanical capacitive pressure sensor using an aluminum flexible diaphragm with on-chip electronics" Thesis (M.S.)—Rochester Institute of Technology, 1999. (Abstract).

Biasotto et al. "Silicon Oxide Sacrificial Layer for MEMS Applications" Microelectronics technology and devices ConferenceProceedings (Electrochemical Society), p. 389-397, 2005.

Aratani et al. "Process and design considerations for surface micromachined beams for a tuneable interferometer array in silicon" Micro Electro Mechanical Systems, 1993, MEMS '93, Proceedings 'An Invesigation of Micro Structures, Sensors, Actuators, Machines, and Systems'. IEEE. Feb. 7-10, 1993 pp. 230-235.

Ko et al. "Micromachined air-gap structure MEMS acoustic sensor using reproducible high-speed lateral etching and CMP process" Journal of Micromechanics and Microengineering, vol. 16, No. 10, p. 2071-2076, IOP Publishing, Oct. 2006.

Yang et al. "Comparative study on chemical stability of dielectric oxide films under HF wet and vapor etching for radiofrequency microelectromechanical system application" Basic Res. Lab., Electron. & Telecommun. Res. Inst., Daejeon, South Korea, Thin Solid Films, vol. 500, No. 1-2, p. 231-236, Publisher: Elsevier Apr. 3, 2006.

M.P.Rao "Single-mask, three-dimensional microfabrication of high-aspect-ratio structures in bulk silicon using reactive ion etching lag and sacrificial oxidation" vol. 85, Dec. 20, 2004 www.engineering.ucsb.edu/~memsucsb/Research/pulications/roa_apl_04.pdf.

H. Stahl et al. "Thin film encapsulation of acceleration sensors using polysilicon sacrificial layers" Jun. 2003 http://ieexplore.ieee.org/Xplore/login.jsp?url=/iel5/8626/27359/01217162.pdf.

A. DeHon "Nanowire Array Architectures for Nanoscale Electronics" 2003 http://legwww.epfl.ch/leg2/cours_nano_06/Cours5_Master_Nanoelectronics_0607.pdf.

Ashurst et al., 2003, Wafer level anti-stiction coatings for MEMS, Sensors and Actuators A, 104:213-221.

Ashurst et al., 2004, Nanometer-thin titania films with sam-level stiction and superior wear resistance for reliable mems performance, Conference on 17th IEEE International Micro Electro Mechanical Systems (MEMS), pp. 153-156.

Ashurst et al., Mar. 2001, Dichlorodimethylsilane as an anti-stiction monolayer for MEMS: a comparison to the octadecyltrichlosilane self-assembled monolayer, Journal of Microelectromechanical Systems, 10(1):41-49.

Bright et al., 2006, Atomic layer deposited films for micro- and nono-scale electro-mechanical systems, ECS 210th Meeting, Abstract 1048.

Hoivik et al., 2003, Atomic layer deposited protective coatings for micro-electromechanical systems, Sensors and Actuators A 103:100-108.

Hong et al., 2007, ALD resist formed by vapor-deposited self-assembled monolayers, Langmuir, 23(3):1160-1165.

Li et al., Lotus effect coating and its application for microelectromechanical systems stiction prevention, 2004 Electronic Components and Technology Conference, pp. 943-947.

Office Action dated Jun. 2, 2011 in Chinese App. No. 200880010748.2.

Notice of Reasons for Rejection dated Aug. 2, 2011 in Japanese App. No. 2010-502237.

Office Action dated Nov. 30, 2011 in Chinese App. No. 200880010748.2.

* cited by examiner

|  | Column Output Signals | |
|---|---|---|
|  | $+V_{bias}$ | $-V_{bias}$ |
| Row Output Signals   0 | Stable | Stable |
| $+\Delta V$ | Relax | Actuate |
| $-\Delta V$ | Actuate | Relax |

ELIMINATE RELEASE ETCH ATTACK BY INTERFACE MODIFICATION IN SACRIFICIAL LAYERS

CROSS-REFERENCE TO RELATED APPLICATIONS

This application claims the benefit of U.S. provisional application Ser. No. 60/910,184, entitled "TREATING UNDERLYING LAYERS FOR CONTROL OF HILLOCK FORMATION IN REFLECTING LAYERS", filed on Apr. 4, 2007 which is incorporated by reference in its entirety.

BACKGROUND

1. Field of the Invention

Embodiments relate to methods of treating underlying sacrificial layers to affect various properties of an overlying layer and/or the underlying sacrificial layer during and/or after removal of the treated sacrificial layer, where the overlying layer is formed over the treated sacrificial layer. Other embodiments relate to methods of making microelectromechanical systems containing overlying layers with surface contours affected by such treatment.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The systems, methods, and devices described herein each have several aspects, no single one of which is solely responsible for its desirable attributes. Without limiting the scope, prominent features will now be discussed briefly. After considering this discussion, and particularly after reading the section entitled "Detailed Description" one will understand how the features described herein provide advantages over other display devices.

An embodiment provides a method of making a microelectromechanical system (MEMS) device. The method of this embodiment includes forming a sacrificial layer over a substrate; treating at least a portion of the sacrificial layer to form a treated sacrificial portion; forming an overlying layer over at least a part of the treated sacrificial portion; and at least partially removing the treated sacrificial portion to form a cavity situated between the substrate and the overlying layer, the overlying layer being exposed to the cavity. The treating may include oxidizing and/or exposing the sacrificial layer to one or more of nitrogen, fluorine, and chlorine. The cavity may be an interferometric modulation cavity. The treated sacrificial portion may include an upper treated sacrificial layer, and a remaining portion of the sacrificial layer comprises a lower substantially untreated sacrificial layer. The upper treated sacrificial layer may be substantially uniform in depth as measured in a direction perpendicular to the substrate. The method may further include removing at least a portion of the upper treated sacrificial layer and at least a portion of the lower substantially untreated sacrificial layer, wherein an etch rate of the upper treated sacrificial layer is greater than an etch rate of the lower substantially untreated sacrificial layer. The lower substantially untreated sacrificial layer may include molybdenum. The upper treated sacrificial layer may include a molybdenum oxide and/or a metal. The metal may include aluminum. The method may further include selecting treatment conditions, for the treating of the sacrificial layer to form the treated sacrificial portion, to reduce hillock formation in the overlying aluminum layer subsequent to the at least partial removal of the treated sacrificial portion, the method further comprising exposing the MEMS device to an otherwise hillock-inducing condition subsequent to the at least partial removal of the treated sacrificial portion. The method may further include selecting the treatment conditions to reduce the number of the hillocks and/or selecting the treatment conditions to reduce the size of the hillocks. The hillocks may include heat-induced hillocks. The otherwise hillock-inducing condition may include exposing the MEMS device to a temperature greater than about 100° C., greater than about 200° C., and/or greater than about 500° C. The method may further include selecting treatment conditions, for the treating of the sacrificial layer to form the treated sacrificial portion, to increase a combined thickness of the upper treated sacrificial layer and the lower substantially untreated sacrificial layer, as compared to the sacrificial layer prior to the treating and/or to decrease the degree of adhesion between the overlying layer and the treated sacrificial portion during the at least partial removal of the treated sacrificial portion. The overlying layer may include a passivation layer and an electrically conductive layer formed over the passivation layer, the passivation layer being configured to aid in allowing the treated sacrificial portion to separate from the electrically conductive layer during the at least partial removal of the treated sacrificial portion. The method may further include selecting treatment conditions, for the treating of the sacrificial layer to form the treated sacrificial portion, to provide a surface of the treated sacrificial portion that is smoother than the surface of the sacrificial layer prior to the treatment. The treatment conditions may include an $N_2O$ or $O_2$ treatment, or both. The treating of the at least a portion of the sacrificial layer may include exposing a surface of the sacrificial layer to oxygen-containing molecules or radicals. The oxygen may include ionized oxygen. The treating of the at least a portion of the sacrificial layer may include heating the sacrificial layer. The treating of the at least a portion of the sacrificial layer may include exposing the sacrificial layer to a plasma. The method may further include removing substantially all of the treated sacrificial portion. The method may further include treating a surface of the sacrificial layer by exposing the surface of the sacrificial layer to sulfur hexafluoride; and forming the overlying layer over the sulfur hexafluoride-treated surface. The method may further include forming an electrode over the substrate; and forming the sacrificial layer over the electrode, wherein the cavity is situated between the electrode and the overlying layer. The method may further include forming an insulating layer over the electrode. The method may further include forming at least one support structure that separates the electrode and the overlying layer.

In some embodiments, an interferometric display device is provided, the device including a first electrode formed over a substrate; a movable second electrode situated over the first electrode and being substantially parallel to the first electrode, wherein the second electrode comprises a treated surface contour facing a cavity formed between the first electrode and the second electrode; and a plurality of supports between the first electrode and the movable second electrode situated to support the movable second electrode. The movable second electrode may include aluminum. The treated surface contour of the cavity-side of the movable second electrode may be substantially insensitive to high temperatures. The device may further include an insulating layer situated on the first electrode. The high temperatures may be greater than about 100° C., 200° C. and/or 500° C. The treated surface contour of the cavity-side of the second electrode may be configured to have a reduced tendency to form hillocks upon exposure to high temperatures. In some embodiments, a display device is provided comprising an array of the interferometric display devices as described herein. The display device may further include a processor that is configured to communicate with the array, the processor being configured to process image data; and a memory device that is configured to communicate with the processor. The display device may further include a driver circuit configured to send at least one signal to the array. The display device may further include a controller configured to send at least a portion of the image data to the driver circuit. The display device may further include an image source module configured to send the image data to the processor. The image source module may include at least one of a receiver, transceiver, and transmitter. The display device may further include an input device configured to receive input data and to communicate the input data to the processor.

In some embodiments, an unreleased interferometric display device is provided, the device including: a first electrode formed over a substrate; a first sacrificial layer formed over at least a portion of the first electrode, the first sacrificial layer comprising a first sacrificial material; a second sacrificial layer formed over at least a portion of the first sacrificial layer, wherein the second sacrificial layer comprises a treated variant of the first sacrificial material; a second electrode formed over at least a portion of the second sacrificial layer; and a plurality of supports between the first electrode and the second electrode situated to support the second electrode upon removal of the first sacrificial layer and the second sacrificial layer. The treated variant may include an oxidized variant. The second sacrificial layer may be substantially uniform in depth as measured substantially perpendicular to the substrate. The first sacrificial layer may include molybdenum. The second sacrificial layer may include molybdenum-oxide. The overlying layer may include a metal. The metal may include aluminum.

In some embodiments, an interferometric display device is provided, the device including: first means for supporting at least a portion of the display device; first means for reflecting light, the first reflecting means being at least partially reflective to light and at least partially transmissive to light and formed over the supporting means; second means for reflecting light, the second reflecting means being at least partially reflective to light, the second reflecting means being movable and situated over the first reflecting means and being parallel to the first reflecting means, wherein the second reflecting means comprises a treated surface contour facing an interferometric cavity between the first reflecting means and the second reflecting means; and second means for supporting the second reflecting means over the first reflecting means. The first supporting means may include a substrate. The first reflecting means may include an optical stack. The second reflecting means may include a movable reflective layer. The second supporting means may include support posts.

In some embodiments, a method of depositing a silver-containing film is provided, the device including: treating a surface of an underlying layer to form a treated surface; and depositing the silver-containing film on the treated surface; wherein said treating reduces hillock formation in the silver-containing film. The hillock formation may include heat-induced hillock formation. Treating the surface of the underlying layer may include exposing the surface to one or more of sulfur hexafluoride, oxygen and a plasma. Treating the surface of the underlying layer may include heating the surface. The method may further include heating the silver-containing film to an otherwise hillock-inducing temperature. The method may further include removing at least a portion of the underlying layer to thereby expose at least a portion of the silver-containing film previously in contact with the treated surface. The method may further include removing the underlying layer before heating the silver-containing film to the otherwise hillock-inducing temperature. Treating the surface of the underlying layer may include smoothing the surface.

These and other embodiments are described in greater detail below.

DETAILED DESCRIPTION

Figure 1:
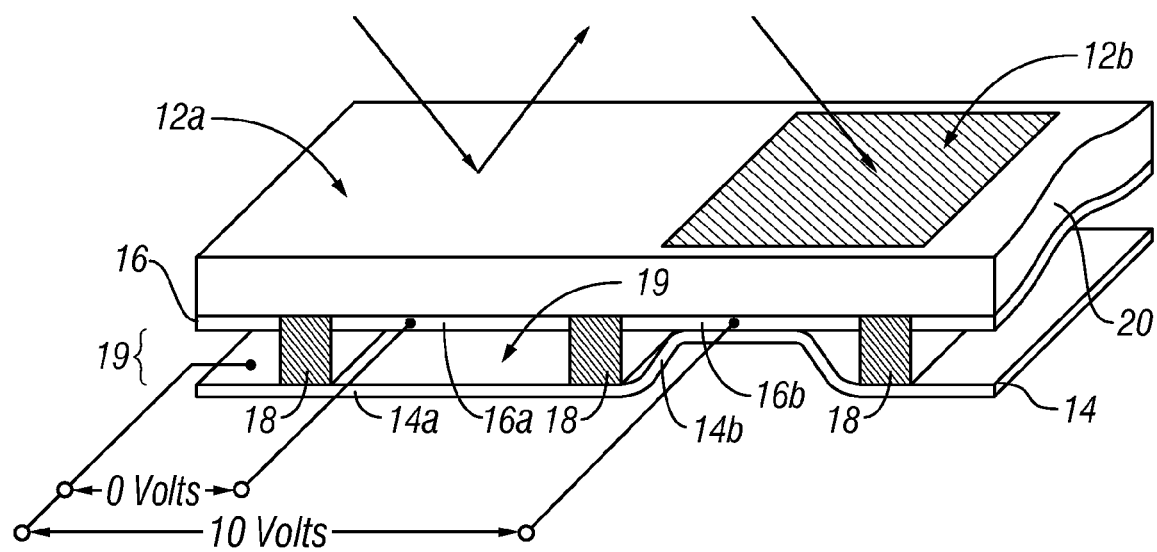
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The following detailed description is directed to certain specific embodiments. However, the teachings herein can be applied in a multitude of different ways. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

MEMS devices can contain metal reflective layers. For example, MEMS devices can contain a movable layer separated from a substrate by a cavity. Formation of the cavity can include formation of a sacrificial layer followed by formation of an overlying layer. It has been found that treating the sacrificial layer (or other underlying layer) using one or more of the methods discussed below can improve one or more characteristics of the sacrificial layer and/or the overlying layer during and/or after removal of the sacrificial layer. In some embodiments, the treating comprises oxidizing a sacrificial layer. In some embodiments, the overlying layer (e.g., a layer comprising aluminum and/or silver) formed on the treated layer has a reduced tendency to form hillocks. Heat or stress, for example, may induce the formation of these hillocks. In some embodiments, the etch rate of the underlying layer is increased, thereby putting less stress on the overlying layer and reducing the likelihood of damaging the overlying layer during removal of the sacrificial layer. In some embodiments, the thickness of the sacrificial layer is increased for a given amount of material compared to a thickness provided by the same amount of untreated material. In some embodiments, the adhesion between the overlying layer and the treated sacrificial layer is reduced compared to the adhesion between the overlying layer and the untreated sacrificial layer. In some embodiments, the treatment closes pin-holes that were formed in the sacrificial layer and prevents damage to other layers during removal of the sacrificial layer. In yet other embodiments, treating the sacrificial layer provides a surface that is smoother than the surface of the sacrificial layer prior to treating.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
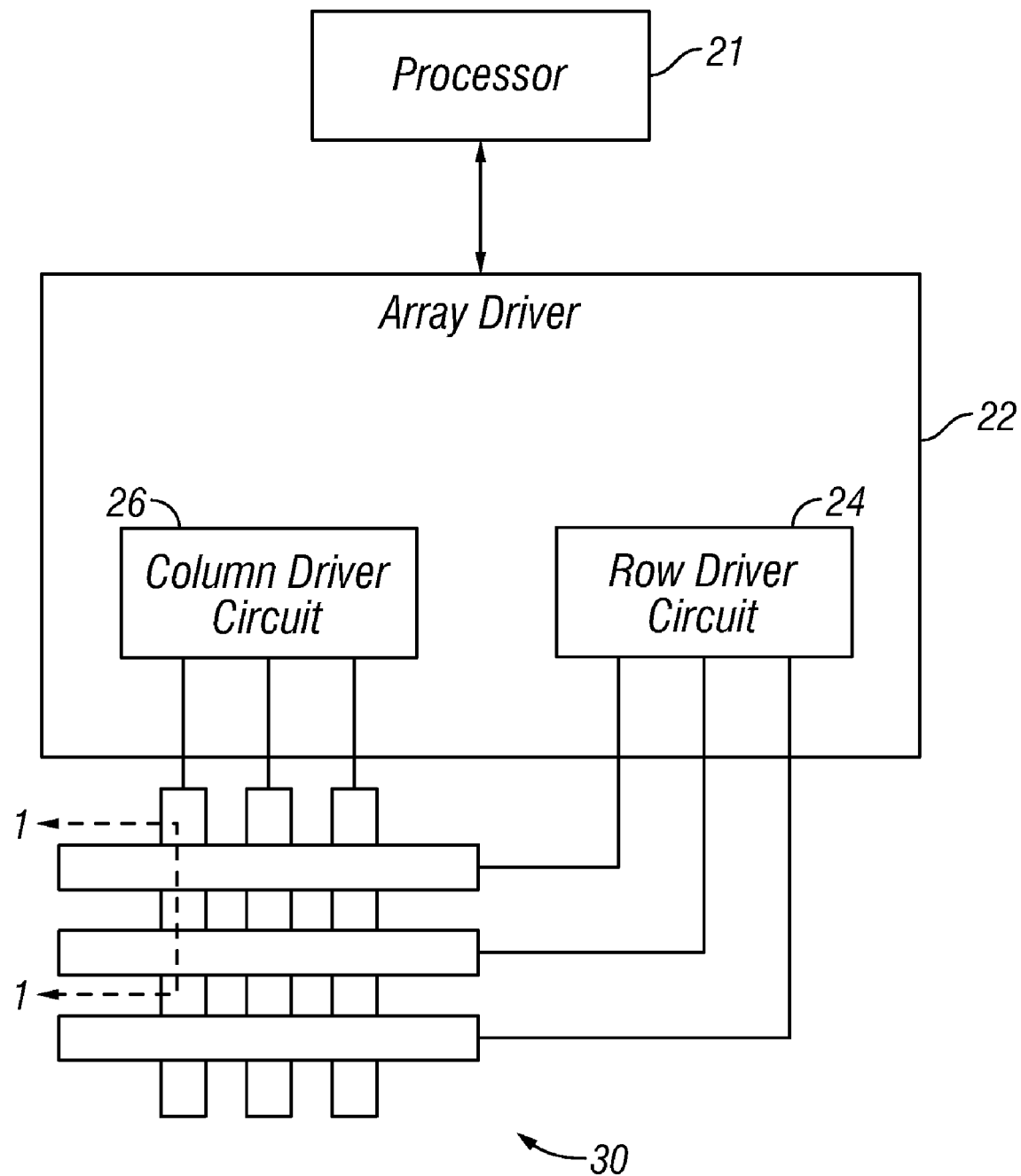
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
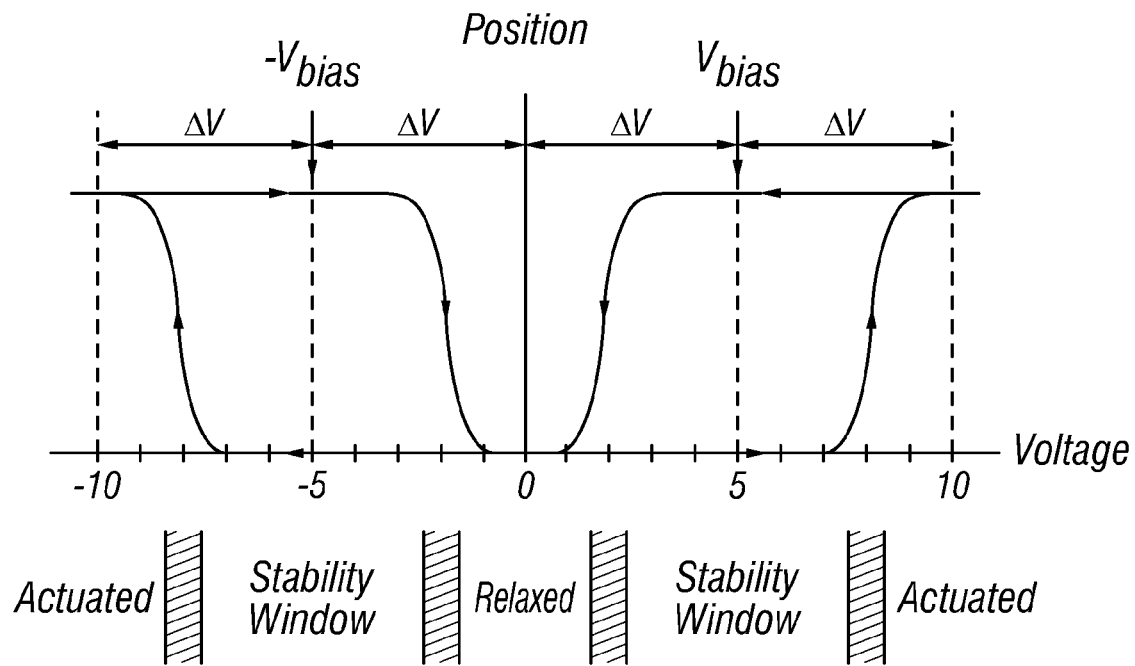
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
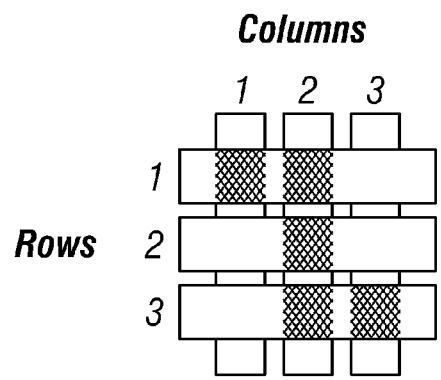
FIGS. 5A and 5B illustrate one exemplary timing diagram for row and column signals that may be used to write a frame of display data to the 3×3 interferometric modulator display of FIG. 2.
Figure 5B:
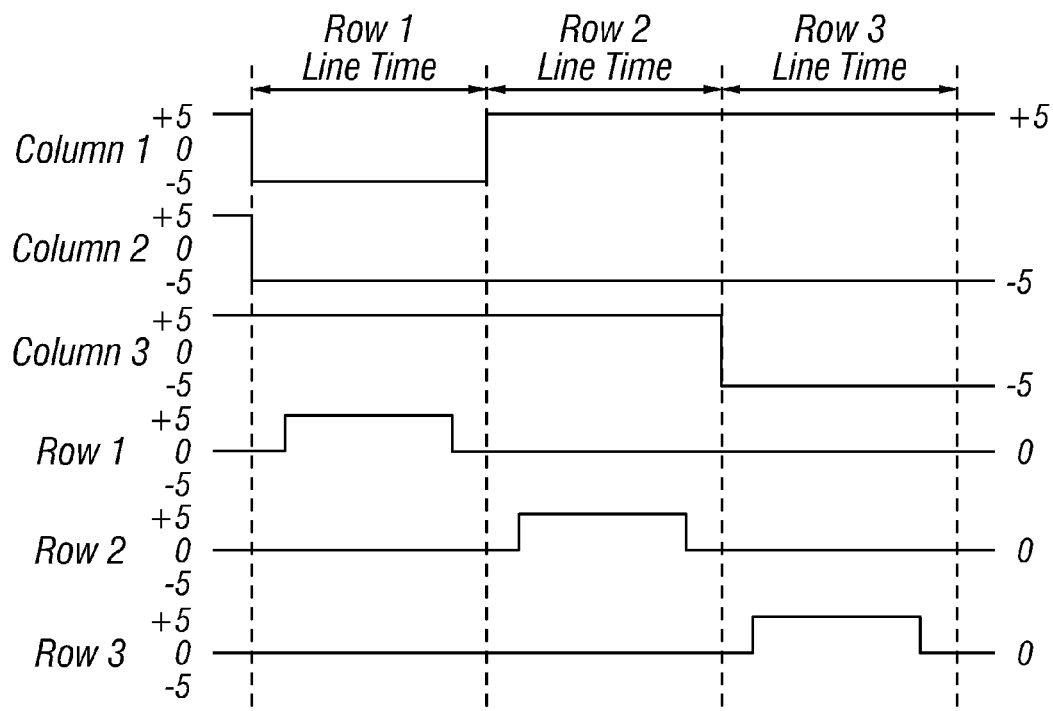

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window.

Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
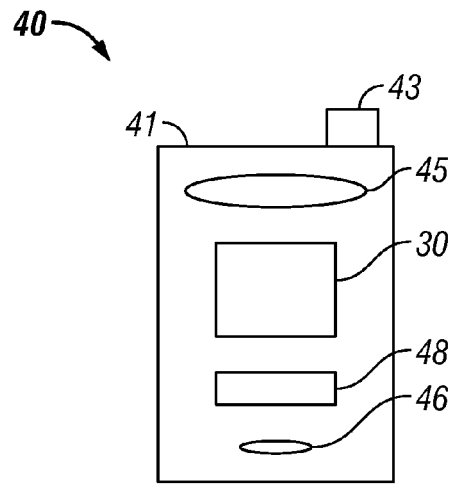
FIGS. 6A and 6B are system block diagrams illustrating an embodiment of a visual display device comprising a plurality of interferometric modulators.
Figure 6B:
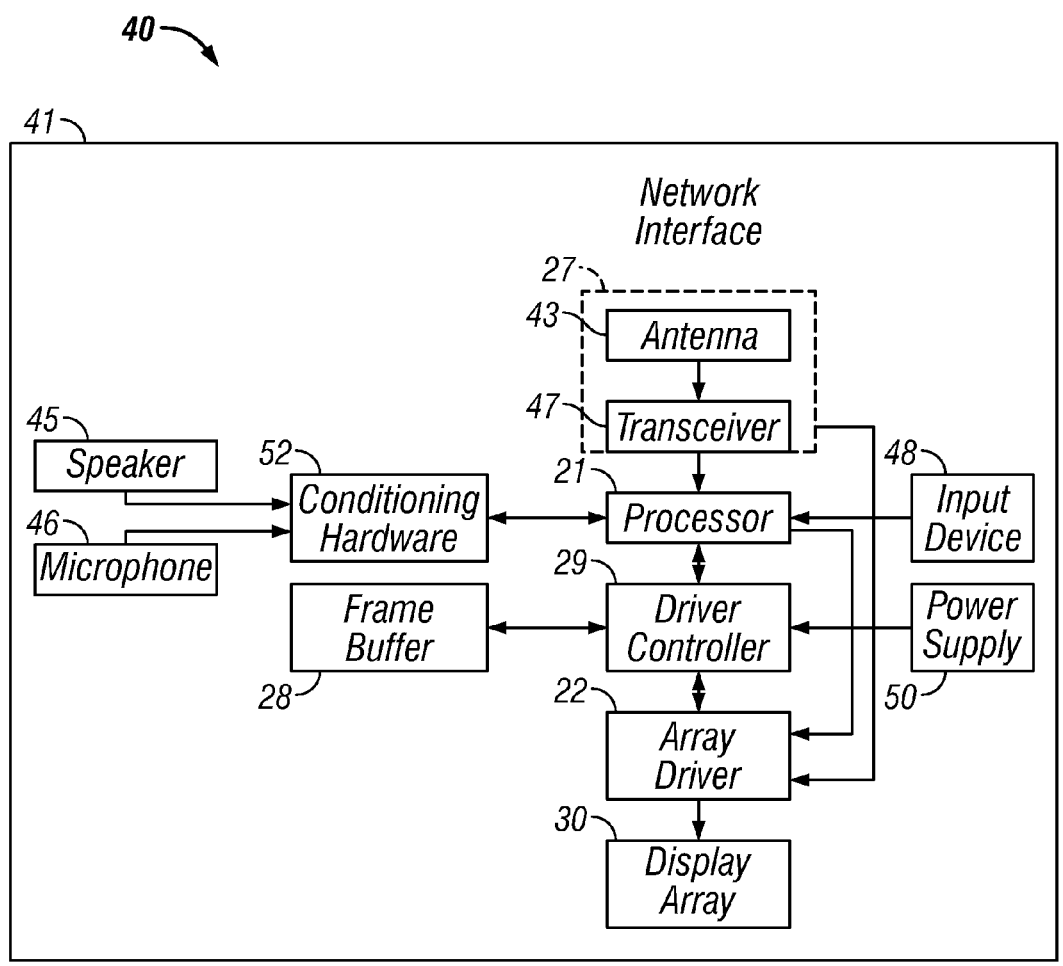

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
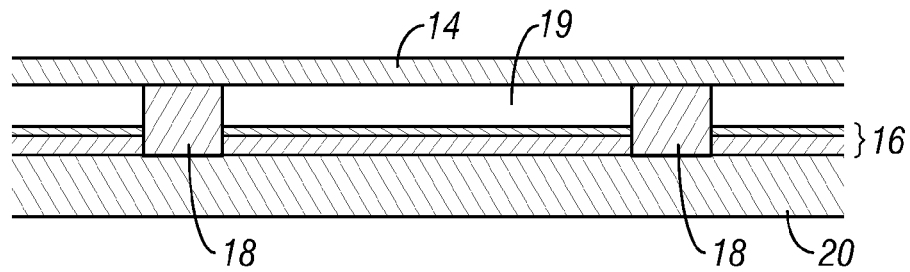
FIG. 7A is a cross section of the device of FIG. 1.
Figure 7B:
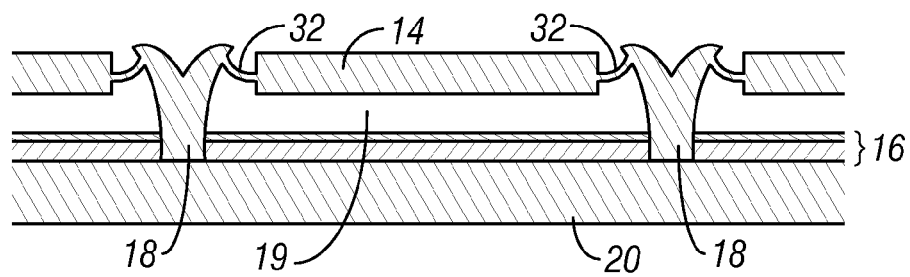
FIG. 7B is a cross section of an alternative embodiment of an interferometric modulator.
Figure 7C:
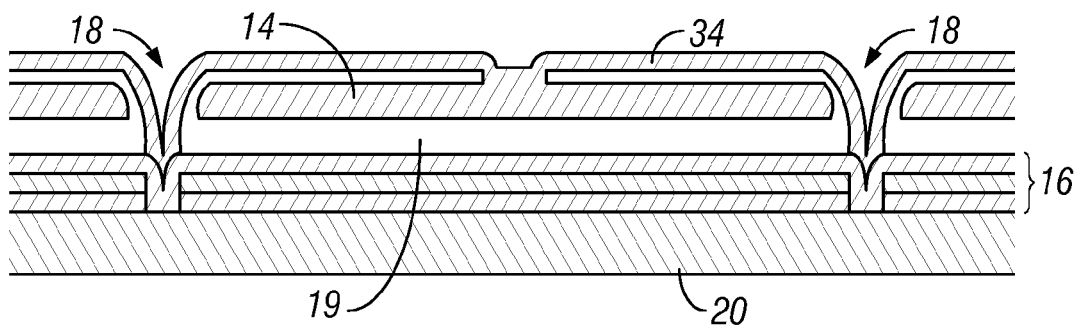
FIG. 7C is a cross section of another alternative embodiment of an interferometric modulator.
Figure 7D:
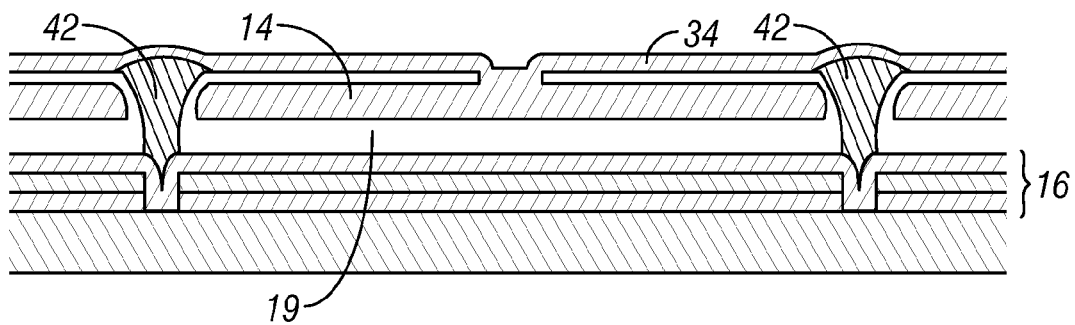
FIG. 7D is a cross section of yet another alternative embodiment of an interferometric modulator.
Figure 7E:
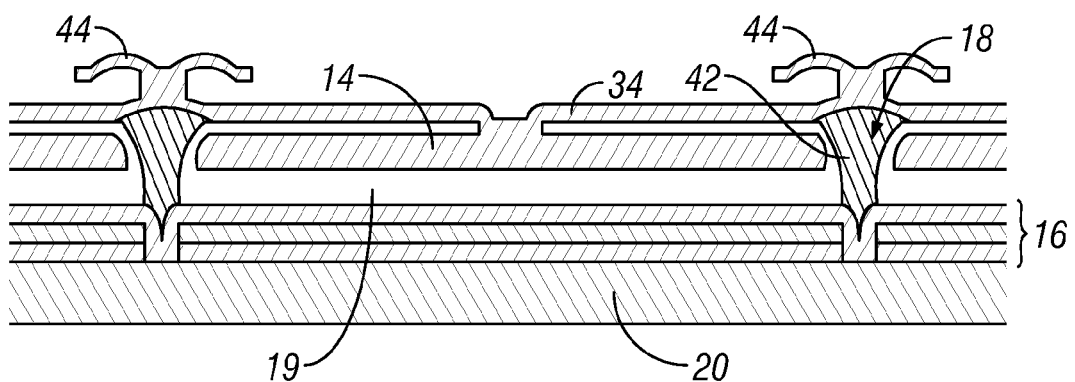
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
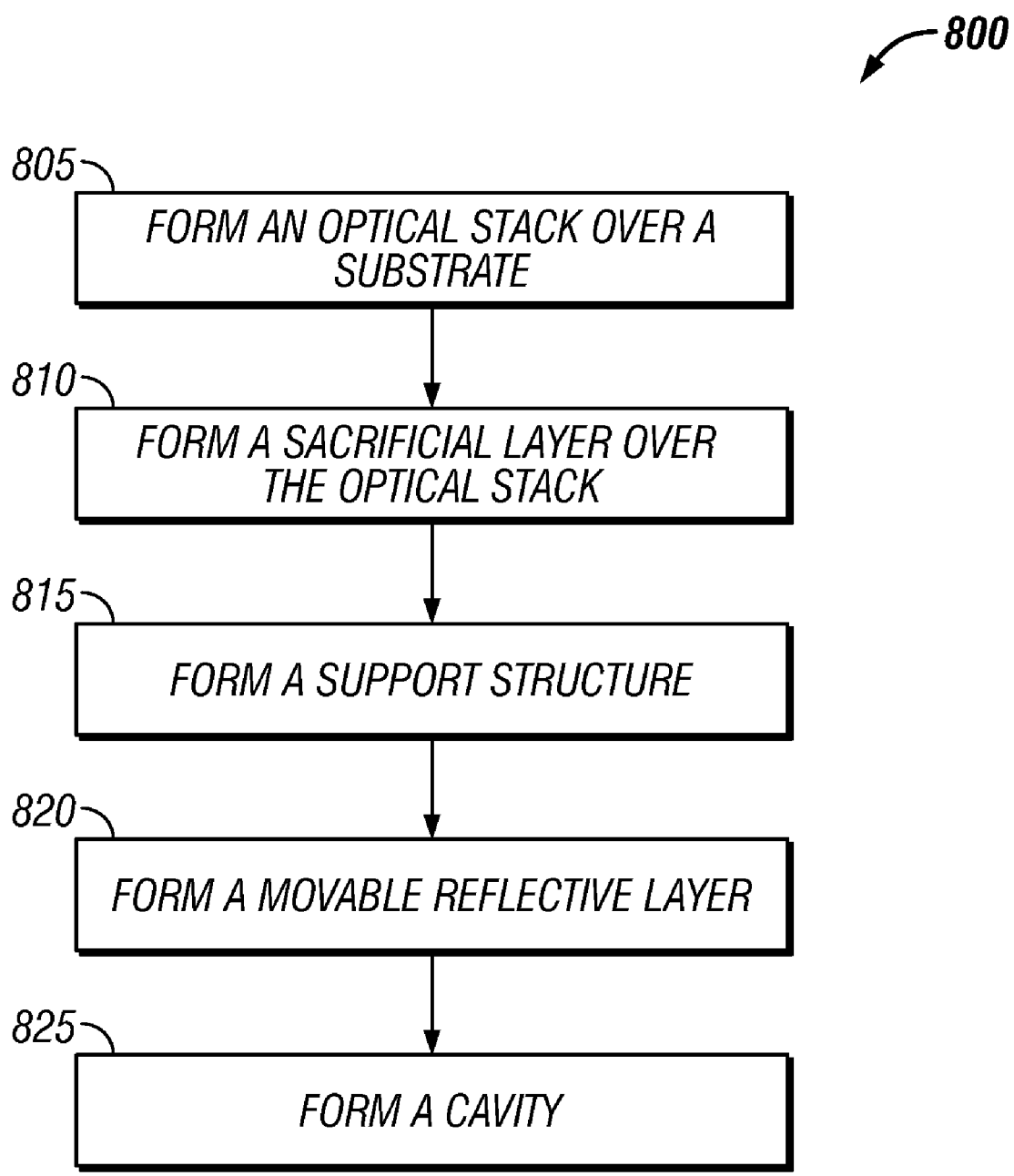
FIG. 8 is a flow diagram illustrating certain steps in an embodiment of method of making an interferometric modulator.

FIG. 8 illustrates certain steps in an embodiment of a manufacturing process 800 for an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. In some embodiments, the optical stack 16 includes an insulating or dielectric layer that is deposited over one or more metal layers (e.g., reflective and/or conductive layers). In some embodiments, the insulating layer is the uppermost layer of the optical stack 16.

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIG. 1. The formation of the sacrificial layer over the optical stack 16 may include deposition of a $XeF_2$-etchable material such as molybdenum, tantalum, tungsten or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial layer to form a support structure aperture, then depositing a material (e.g., a polymer) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7D illustrates the lower end of the support post plugs 42 in contact with the optical stack 16.

The process 800 illustrated in FIG. 8 continues at step 820 with the formation of a movable reflective layer such as the movable reflective layer 14 illustrated in FIGS. 1 and 7. The movable reflective layer 14 may be formed by employing one or more deposition steps, e.g., reflective layer (e.g., aluminum, aluminum alloy, silver, silver alloy) deposition, along with one or more patterning, masking, and/or etching steps. As discussed above, the movable reflective layer 14 is typically electrically conductive, and may be referred to herein as an electrically conductive layer. In some embodiments, the reflective layer 14 comprises aluminum. In some embodiments, the reflective layer 14 comprises silver. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial material (deposited at step 810) to an etchant. For example, an etchable sacrificial material such as molybdenum, tantalum, tungsten or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the cavity 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

The performance of MEMS devices in general and interferometric modulators in particular, may be adversely affected by surface characteristics of underlying layers and their affect on overlying layers. For example, a condition referred to herein as "hillock formation" in the movable electrode layer can be affected by the surface characteristics of the underlying sacrificial layer. Hillock formation is characterized by the formation of small protrusions ("hillocks") in or on a metal surface, e.g., the surface of the movable electrode layer. The size of the hillocks may vary, depending on the formation conditions, and is most often in the size range of about 10 nanometers (nm) in height to about 10 microns in height and more typically in the range of about 100 nanometers (nm) in height to about 1 micron in height, although larger or smaller hillocks may occasionally be observed. Hillocks are particularly likely to form on the surface of an aluminum-containing and/or silver-containing layer. Hillocks typically form during or after exposure to high temperatures, such as during high-temperature storage. Hillocks can also form on the surface due to other ambient conditions including, for example, when being exposed to heat or stress.

It has been found that hillock formation can negatively influence the performance of MEMS devices. Hillocks can alter the cavity distance between the movable electrode layer and the optical stack, thereby affecting the wavelength of light that is reflected by the device. The hillocks can cause a reflection of a second-order blue color or other colors as well.

In an embodiment, a method of reducing hillock formation (e.g., heat-induced hillock formation) in an aluminum-containing and/or silver-containing layer has been developed. For example, an embodiment provides a method of depositing an aluminum-containing and/or silver-containing film comprising treating a surface of an underlying layer to form a treated surface and depositing the aluminum-containing and/or silver-containing film on the treated surface, wherein the treating reduces hillock formation in the aluminum-containing and/or silver-containing film. Thus, the contour of a surface of the aluminum-containing and/or silver-containing film can be affected by this treating. The surface contour may be characterized as being, for example, relatively flat due to a treatment as described herein. As referred to herein, the term "treated surface contour" refers to a contour of a surface resulting from being formed on a treated surface. For example, as described below, the treated surface contour 155 is one that was formed on the treated sacrificial surface 145. A treated surface contour may comprise fewer hillocks or may be comprise less height variability than a surface contour not formed on a treated surface but otherwise comparable.

Figure 9:
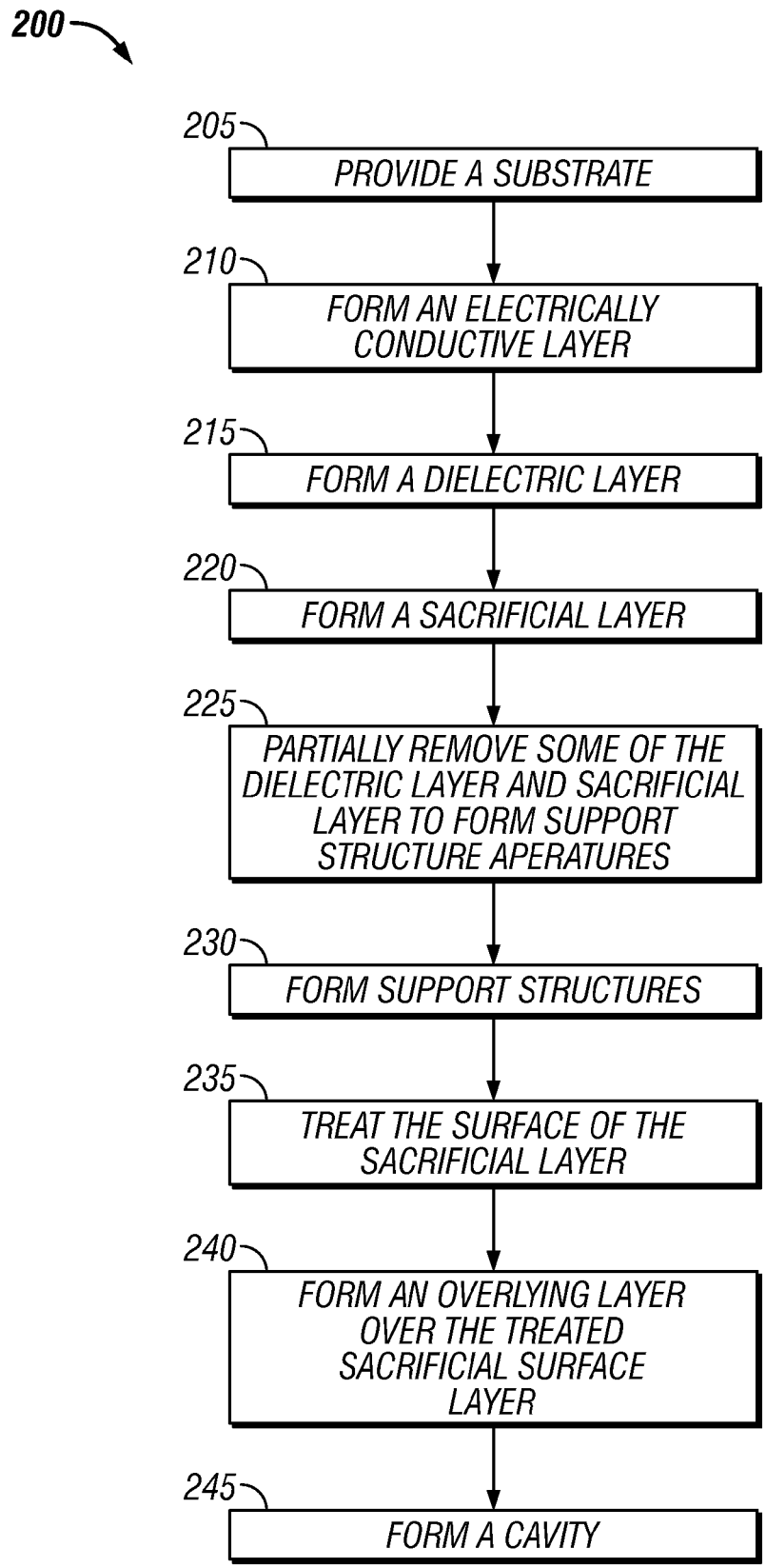
FIG. 9 is a flow diagram illustrating an embodiment of a method of making a MEMS device.

FIG. 9 is a flow diagram illustrating certain steps in an embodiment of a method of making a MEMS device. In some embodiments, a sacrificial layer is treated by chlorine, nitrogen (e.g., by nitration or nitridation), fluorine or oxygen (e.g., by oxidation) to affect characteristics of the sacrificial layer and/or an overlying layer during or subsequent to removal of the sacrificial layer. The treatment may change the chemical composition or a chemical property of a surface of the sacrificial layer. In some instances, the treatment can create a diffusion layer between a sacrificial and an overlying layer. FIG. 9 will first be described for an embodiment in which hillock formation is reduced, however, other embodiments are described below. Such steps may be present in a process for manufacturing, e.g., interferometric modulators of the general type illustrated in FIGS. 1 and 7, along with other steps not shown in FIG. 9. FIGS. 10A through 10H schematically illustrate an embodiment of a method for fabricating a MEMS device using conventional semiconductor manufacturing techniques such as photolithography, deposition, masking, etching (e.g., dry methods such as plasma etch and wet methods), etc. Deposition may include "dry" methods such as chemical vapor deposition (CVD, including plasma-enhanced CVD and thermal CVD) and sputter coating, and wet methods such as spin coating. With reference to FIGS. 9 and 10, the process 200 begins at step 205 where a substrate 100 is provided. In one embodiment, the substrate 100 may comprise any transparent material such as glass or plastic.

Figure 10A:
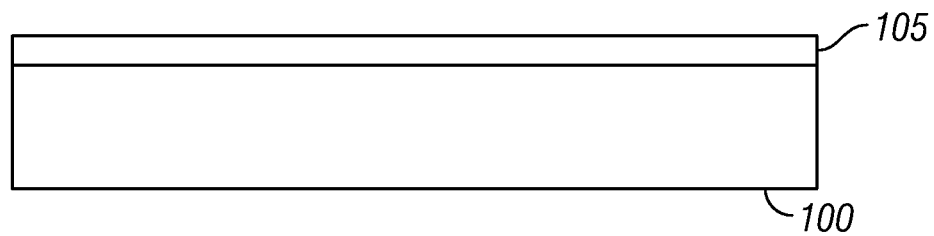
FIGS. 10A through 10H schematically illustrate an embodiment of a method for fabricating a MEMS device.

The process 200 continues at step 210 with the formation of a first electrically conductive layer 105 on the substrate 100 as shown in FIG. 10A. The first electrically conductive layer 105 can be a single layer structure or multiple sub-layer structure as described above. In a single layer structure where the layer 105 functions as both electrode and mirror, the layer 105 is formed by deposition of an electrically conductive material on the substrate 100. The first electrically conductive layer 105 may be formed into electrodes through subsequent patterning and etching not shown in FIG. 9 or 10. The first electrically conductive layer 105 may be a metal or a semiconductor (such as silicon) doped to have the desired conductivity. In one embodiment (not shown in FIG. 10), the first electrically conductive layer 105 is a multilayer structure comprising a transparent conductor (such as indium tin oxide) and a primary mirror or partially reflective layer (such as chromium).

Figure 10B:
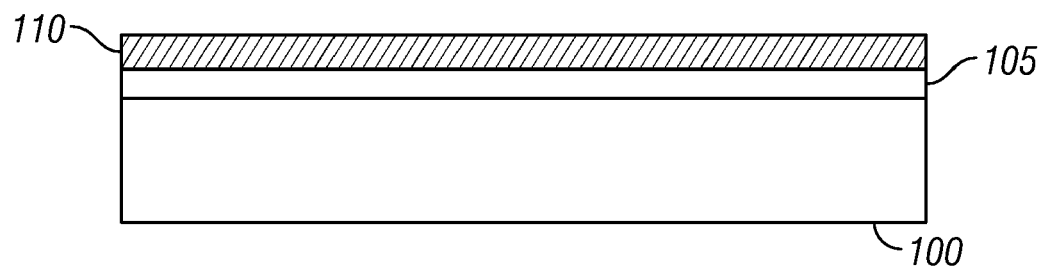

The process 200 continues at step 215 with the formation of a dielectric layer 110 over at least a portion of the electrically conductive layer 105 as shown in FIG. 10B. The dielectric layer 110 may comprise insulating materials such as silicon oxide and/or aluminum oxide. The dielectric layer 110 serves to insulate the first electrically conductive layer 105 from an electrically conductive movable layer (such as movable layer 14 of FIGS. 1 and 7) in an interferometric modulator. The dielectric layer 110 may be formed by known deposition methods, e.g., CVD. In some embodiments, the optical stack 16 of the resulting device includes both the electrically conductive layer 105 and the dielectric layer 110.

Figure 10C:
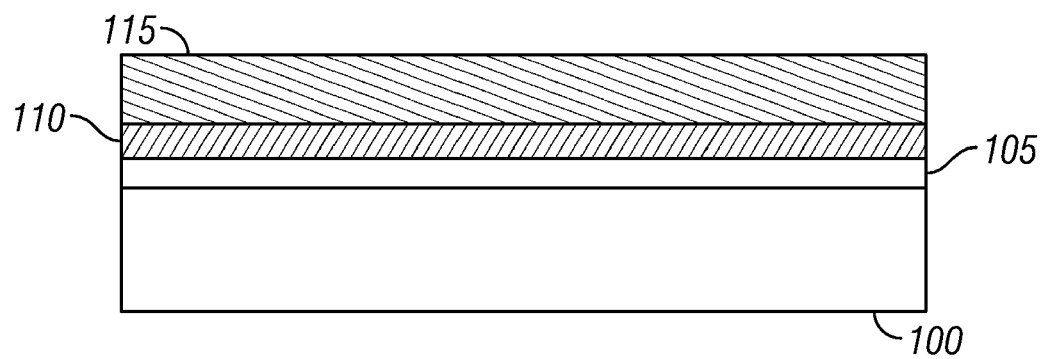
Figure 10D:
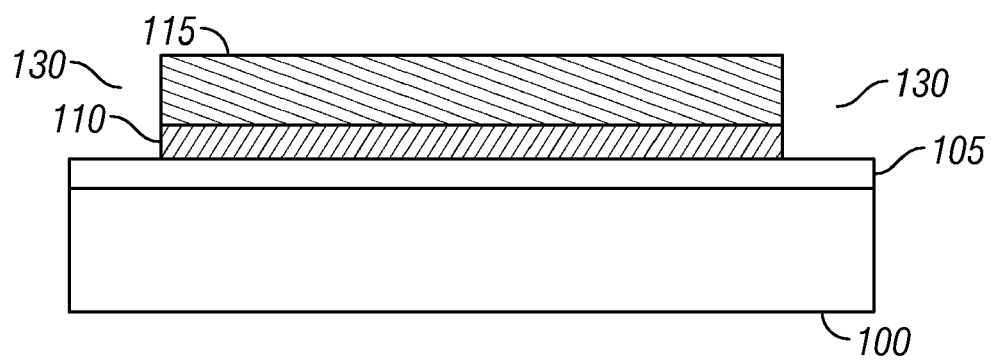
Figure 10E:
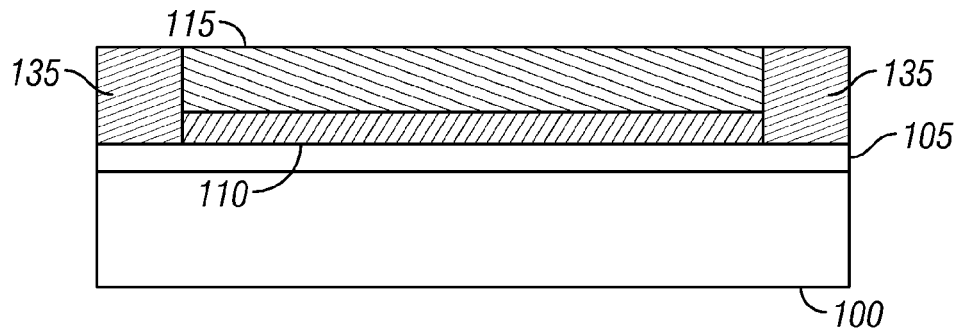

The process 200 continues at step 220 with the formation of a sacrificial layer 115 as shown in FIG. 10C. The sacrificial layer 115 may comprise a material etchable by $XeF_2$, e.g., molybdenum, tantalum or tungsten. Deposition methods such as CVD, sputtering or spin coating may be used in forming the sacrificial layer 115. The sacrificial layer 115 is patterned and etched at step 225 to form one or more support structure apertures 130, as shown in FIG. 10D. In the embodiment shown the support structure apertures 130 extend entirely through the first sacrificial layer 115 and the dielectric layer 110 to the first electrically conductive layer 105. At step 230, support structure material is deposited into the apertures 130 forming support structures 135 as shown in FIG. 10E. The support structures 135 may comprise a non-conductive material.

Figure 10F:
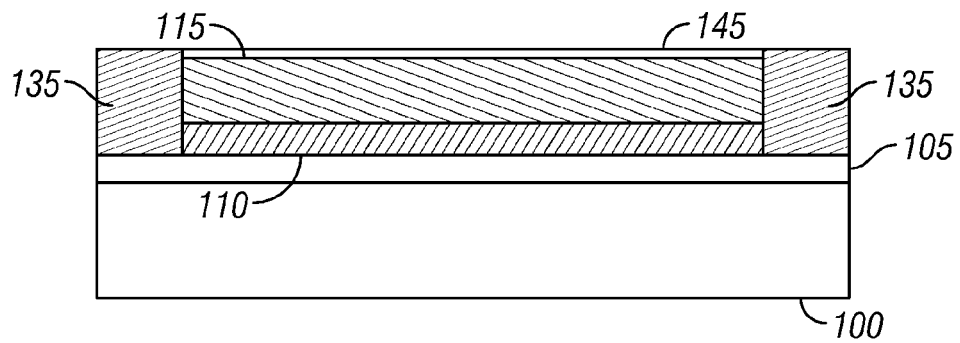

The process 200 continues at step 235 with the treating of the surface of the sacrificial layer 115, such that the sacrificial layer 115 then comprises a treated sacrificial portion 145, as shown in FIG. 10F. The treating of the surface of the sacrificial layer 115 to form the treated sacrificial portion 145 can be conducted in various ways, e.g., by plasma, oxidation, sulfur hexafluoride, or combinations thereof, as described in greater detail below. For example, in some embodiments, the treatment comprises oxidation, as at least a portion of the sacrificial layer 115 is oxidized to form an oxidized sacrificial portion. The treating of the sacrificial layer 115 may be carried out in such a way as to produce layers, as illustrated in FIG. 10F by the upper treated (e.g., oxidized) sacrificial layer 145 and the remaining lower portion of the sacrificial layer 115, comprising a substantially untreated (e.g., unoxidized) sacrificial layer. In some embodiments, the oxidized sacrificial layer is substantially uniform in depth as measured in a direction perpendicular to the substrate 100.

In some embodiments, the surface of the sacrificial layer 115 is treated with a plasma. In other embodiments, the surface of the sacrificial layer 115 is treated with a gas comprising oxygen gas and/or sulfur hexafluoride gas. In still other embodiments, the surface of the sacrificial layer 115 is treated with a plasma comprising oxygen gas and/or sulfur hexafluoride gas. The oxygen and/or sulfur hexafluoride gas may comprise molecules and/or radicals of those substances. The surface of the sacrificial layer 115 can be treated with ionized oxygen and/or ionized sulfur hexafluoride. One or more treatments of the surface of the underlying layer (e.g., the sacrificial layer 115) described herein can, in some embodiments, smooth the surface. Details of several treatments methods that may be performed at the step 235 are discussed below.

Figure 10G:
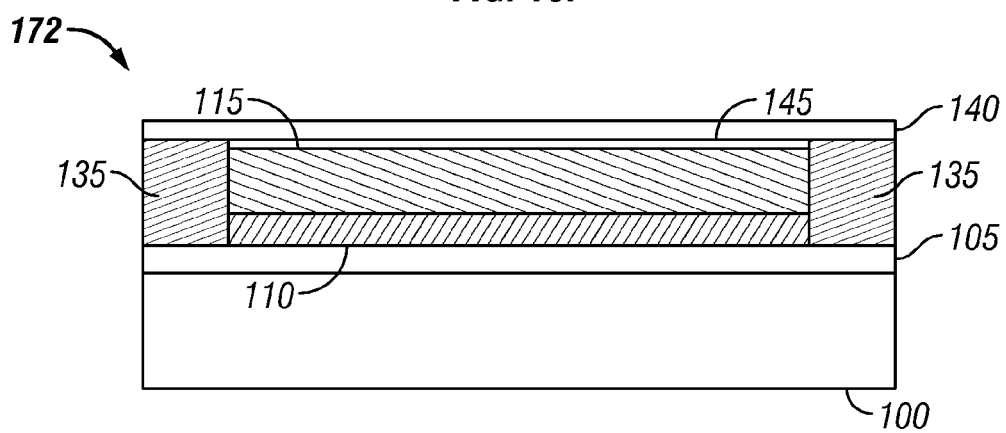

The process 200 continues at step 240 with the formation of an overlying layer 140, e.g., a second electrically conductive layer, over the treated sacrificial portion 145 and, in the illustrated embodiment, over the support structures 135, as shown in FIG. 10G. In an embodiment, at least part of the overlying layer 140 is formed on at least part of the treated sacrificial portion 145. In an embodiment, the overlying layer 140 comprises a movable layer such as the movable reflective layer 14 of an interferometric modulator as shown in FIGS. 1 and 7. Since the sacrificial layer 115 and the treated sacrificial portion 145 are still present at this stage of the process 200, the movable layer is typically not yet movable. A partially fabricated MEMS device 172, e.g. a partially fabricated interferometric modulator, that contains a sacrificial layer (the layers 115, and 145 in this embodiment) may be referred to herein as an "unreleased" MEMS device. The overlying layer 140 may comprise a metal (e.g. aluminum, aluminum alloy, silver, or silver alloy). In some embodiments, the overlying layer 140 comprises aluminum. In some embodiments, the overlying layer 140 comprises silver. Forming the electrically conductive layer 140 in step 240 may include one or more deposition steps as well as one or more patterning or masking steps.

Figure 10H:
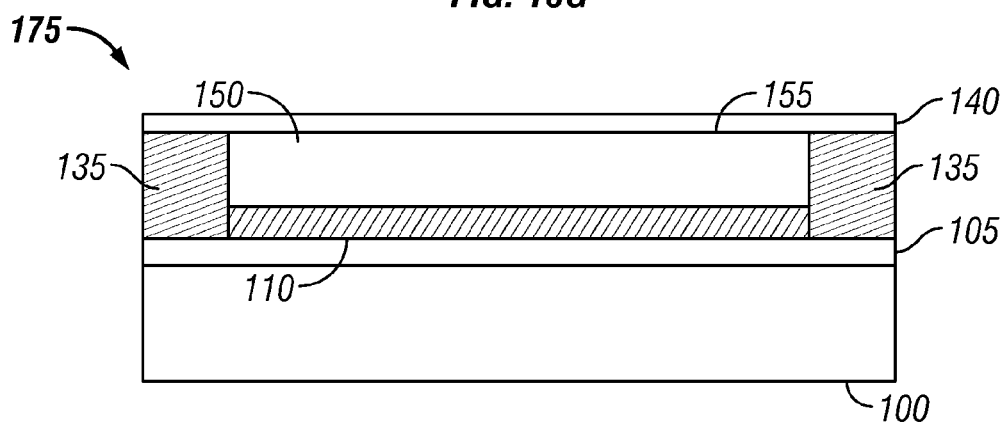

The process 200 continues at step 245 where at least a portion the treated (e.g., oxidized) sacrificial layer 145 and, optionally, a portion of the untreated (e.g., unoxidized) sacrificial layer 115 is removed (e.g., by etching) as shown in FIG. 10H. One or more support structures 135 can support the overlying layer 140, thereby forming a gap or a cavity 150. In some embodiments, the cavity 150 is formed between the dielectric layer 110 and the overlying layer 140 such that the overlying layer 140 is exposed to the cavity as illustrated in FIG. 10H. The treated surface contour 155 of the overlying layer 140 may comprise fewer hillocks than a comparable surface contour formed on an untreated sacrificial structure.

The removal of the sacrificial layers can be accomplished, for example, by exposure to an etchant such as $XeF_2$ (as depicted in FIG. 10H), $F_2$ or HF alone, or in combination. In one embodiment, substantially all of the sacrificial layer 115 and the treated sacrificial portion 145 are removed in the etching process. In one embodiment, the cavity 150 is an interferometric cavity between an optical stack 16 (comprising the electrically conductive layer 105 and the dielectric layer 110) and the overlying layer 140 is a movable conductive layer as discussed above. After formation of the cavity 150, the resulting MEMS device, e.g., the interferometric modulator 175, is in a "released" state.

The released interferometric modulator 175 may be subjected to numerous additional processing steps (not shown in FIG. 9 or 10), one or more of which may involve heating the interferometric modulator 175 to a temperature that would be hillock inducing in the overlying layer 140 in the absence of the treating step 235. In some embodiments, treatment of the surface of the sacrificial layer 115 serves to reduce hillock formation (e.g., heat-induced hillock formation) in the overlying layer 140, thereby improving the operation of the MEMS device. In some embodiments, reduced hillocks refers to a reduced number of the hillocks as compared to the number expected in a similar electrically conductive layer not subjected to one of the described treatments. In other embodiments, reduced hillocks refers to a reduced size of the hillocks as compared to the size expected in a similar electrically conductive layer not subjected to one of the described treatments. In still other embodiments, reduced hillocks refers to both a reduced number and reduced size of the hillocks as compared to the number and size expected in a similar electrically conductive layer not subjected to one of the described treatments.

One skilled in the art can identify appropriate parameters and/or operating conditions for the methods disclosed herein using routine experimentation guided by the teachings provided herein. For example, optimal parameters associated with treatment of the surface of the sacrificial layer, such as pressures, power, exposure time, and/or flow rate, can be obtained by systematically varying the parameters and observing the extent of hillock formation (e.g., heat-induced hillock formation). In some embodiments, the pressure can be between 40 and 60 milliTorr (mT). The power can, in some embodiments, be between 800 and 1000 Watts. In some embodiments, sulfur hexafluoride is exposed to the sacrificial layer at a flow rate of 30-100 standard cubic centimeters per minute (sccm). In some embodiments, oxygen is exposed to the sacrificial layer at a flow rate of 100-200 sccm. The sacrificial layer may be exposed to a treatment for various periods of time, e.g., 15-25 seconds. In some embodiments, the substrate is not heated.

In some embodiments, the reduction in hillock formation occurs on the surface of the overlying layer 140 that had been adjacent to the treated sacrificial surface 145. In such embodiments, the reduction in hillock formation occurs on the surface of the electrically conductive layer facing the cavity 150, referred to as the cavity-side surface of the overlying layer 140. In the MEMS device of FIG. 10, the surface of the overlying layer that had been adjacent to the treated sacrificial surface 145 is the cavity-side surface 155 of the overlying layer 140. Thus, treatment of the sacrificial surface 145 can affect the contour or shape of the cavity-side surface of the overlying layer 140.

In some embodiments, the process 200 may include additional steps and the steps may be rearranged from the illustrations of FIGS. 9 and 10. For example, the surface of the sacrificial layer 115 may be treated before support structure apertures 130 are formed, or after the support structure apertures 130 are formed, but before the support structures 135 are formed in the support structure apertures 130. The support structures may be formed before the sacrificial layer is formed, thereby eliminating the step of forming support structure apertures.

The methods described herein of reducing hillock formation can be applied to various MEMS devices comprising an aluminum-containing and/or silver-containing film adjacent to a cavity, wherein the cavity is formed by removing at least part of a sacrificial layer.

Hillock formation induced, for example, by high temperatures in aluminum-containing and/or silver-containing films, such as the overlying layer 140 of a MEMS device, can be reduced by the methods of treating the surface of the underlying sacrificial layer described herein. As used herein, high temperatures or hillock-inducing temperatures are temperatures that would produce hillocks in comparable aluminum-containing and/or silver-containing films not subjected to a disclosed treatment. In some embodiments, hillock-inducing temperatures are greater than or equal to 85° C., greater than or equal to 100° C., greater than or equal to 200° C., or greater than or equal to 500° C. As used herein, the term "heat-induced hillock formation" refers to hillock formation caused by exposure to high temperatures.

Although, in some embodiments, the aluminum-containing and/or silver-containing films are subjected to these high temperatures, in other embodiments, they are not. In some embodiments, aluminum-containing and/or silver-containing films produced by the methods described herein would exhibit reduced hillock formation if they were subjected to high temperatures, regardless of whether or not such films are actually exposed to high temperatures. In some embodiments, at least part of the underlying layer is removed before the aluminum-containing and/or silver-containing film is subjected to high temperatures. In other embodiments, the underlying layer is not removed before the aluminum-containing and/or silver-containing film is subjected to high temperatures. In an embodiment, the MEMS device of FIG. 10H is exposed to high temperatures during storage after the sacrificial layer 115 and the treated sacrificial portion 145 have been removed. In this embodiment, treating the surface of the sacrificial layer 115 reduces the hillocks formed on the cavity-side surface 155 of the overlying layer 140. In some embodiments, hillock formation is caused by a condition other than temperature.

The interferometric modulators and the interferometric display devices described herein can be incorporated in apparatuses comprising a display, a processor that is configured to communicate with the display, wherein the processor is configured to process image data, and a memory device that is configured to communicate with the processor. In some embodiments, the apparatuses can further comprise a driver circuit configured to send at least one signal to the display and, in some of these embodiments, a controller configured to send at least a portion of the image data to the driver circuit. In other embodiments, the apparatuses can comprise an image source module configured to send the image data to the processor, wherein the image source module optionally comprises at a receiver, transceiver, transmitter, or some combination thereof. The apparatuses can also comprise an input device configured to receive input data and to communicate the input data to the processor.

An interferometric modulator is constructed according to the above-described method, as illustrated in FIGS. 9 and 10. This example describes an embodiment of treating the surface of the sacrificial layer at step 235 of FIG. 9, such that an aluminum-containing second electrically conductive overlying layer 140 formed on the treated sacrificial portion 145 is characterized by reduced hillock formation (e.g., heat-induced hillock formation). It is understood that embodiments of the invention also include related methods, in which parameters of the treatment are varied: e.g., variations in the temperature, pressure, time of treatment, power, flow rates, and/or gases disclosed in this example.

A plasma etch chamber is used to treat the sacrificial layer at a power level of approximately 900 Watts of direct current power applied between a cathode and an anode to create the plasma (after vacuum evacuation of the chamber). The chamber is maintained at a pressure of approximately 50 mT with an appropriate amount of sulfur hexafluoride gas and oxygen gas flowing into the chamber for approximately 20 seconds. The flow rates of the gases are varied in order to determine effective flow rates. The sulfur hexafluoride is fed at a rate of approximately 30 sccm, and the oxygen is fed at a rate of approximately 200 sccm. The treating process is conducted at approximately 25° C., though the plasma may cause an increase in the temperature without any external heat being provided. (except for heating induced by the plasma that may cause a temperature rise—no separate substrate heating is used in this embodiment).

After an aluminum-containing second electrically conductive layer is formed on the treated sacrificial surface and a cavity is formed by removing the sacrificial layer, the apparatus is exposed to a temperature greater than 85° C. The aluminum-containing layer is characterized by reduced hillock formation as compared to a comparable apparatus in which the sacrificial layer is not treated as described above.

An interferometric modulator can be constructed as described above, except that both the oxygen and sulfur hexafluoride are fed at a rate of approximately 100 sccm. Similar results are obtained.

In some embodiments, the treatment of the sacrificial layer at the step 235 in FIG. 9 comprises oxidizing the sacrificial layer 115 in a way that affects the interaction between the treated (oxidized) sacrificial portion 145 and the overlying layer, e.g., the overlying layer 140, to eliminate or reduce possible damage to the overlying layer or other layers mechanically coupled with the overlying layer.

For MEMs devices, such as interferometric modulators, for example, a sacrificial layer 115 is patterned to form the support structures 135 of the device. The sacrificial layer 115 forms the space between the mechanical layer (e.g., the overlying layer 140) and an etch stop layer (not illustrated) that may be formed in some embodiments over the dielectric layer 110. The final step in forming the device is to remove the sacrificial layer to release the mechanical layer from the etch stop layer, thereby forming a cavity in the pixel area.

In some embodiments, the mechanical layer (e.g., the overlying layer 140) is patterned with etch holes or openings. Removal of the sacrificial layer 115 can be accomplished by flowing a dry etchant such as $XeF_2$ gas through these holes and openings to contact the sacrificial material. As the $XeF_2$ contacts the sacrificial material, it generally begins etching the sacrificial material downward and then laterally in a growing radial pattern. See, e.g., FIG. 14 of U.S. Patent Publication No. 2006-0076311. Since the etching is initiated at different holes throughout the pixel and the lateral release direction generally proceeds at a slower rate that in the downward direction, the final stage of a typical release often results in the formation of many surrounded or remaining islands or columns. See, e.g., FIGS. 17-18 of U.S. Patent Publication No. 2006-0076311. Because the islands are increasingly being reduced in volume, these islands can serve as pivot points with a high concentration of mechanical stress being exerted from the mechanical layer. The high concentration of stress in these columns can cause the mechanical layer to pull away and eventually tear off a layer below the columns (e.g., the dielectric layer 110 in FIG. 10). This undesirable outcome is termed release breakdown and such breakdown may lead to the attack of layers embedded below the etch stop layer that are susceptible to the release etchant, termed release attack.

It has been found that one way to prevent the underlying layers from being damaged as described above, is to oxidize a surface of the sacrificial layer such that the mechanical layer can be separated from the etch stop layer before release breakdown initiates. In other words, the mechanical layer can be freed rapidly from the sacrificial layer before islands or columns have a chance to form.

The release attack can be reduced by preventing stress induced damage on the etch stop layer(s) during the release etch of the sacrificial layer or layers through interface modification. In some embodiments the interface modification comprises treatment of the sacrificial layer as described herein. In an embodiment, the treatment comprises oxidation. Thus, the oxidizing treatment of some embodiments performed at step 235 may be conducted for the purpose of interface modification to promote faster etching of the oxidized sacrificial layer 145 compared to the unoxidized sacrificial layer 115, to degrade the adhesion between the oxidized sacrificial layer 145 and the overlying layer 140, or both.

It has been found that, for a multilayer sacrificial stack such as the oxidized sacrificial layer 145 and the unoxidized sacrificial layer 115, when the oxidized sacrificial layer etches at a faster rate than the underlying unoxidized sacrificial layer 115, the interface between the overlying layer 140 and the oxidized sacrificial layer 145 will tend to separate prior to significant island formation. In addition, if adhesion forces between the oxidized sacrificial layer 145 and the overlying layer 140 are made to be weak through interface modification such as plasma oxidation, this will further enhance the separation process. Similarly, if adhesion forces between the oxidized sacrificial layer 145 and the unoxidized sacrificial layer 115 are made to be weak through treatment such as plasma oxidation, this will also enhance the separation process. Also, as any two sacrificial layers are physically unattached from each other, more surface area in the sacrificial layer is exposed to the etchant. This exposed area is available to be etched up or down vertically; this mechanism can suppress island formation since the lateral release component become less significant.

The interface modification techniques of these embodiments include but are not limited to thermal (or heat) treatment, wet processing, oxidation, plasma treatment, deposition of a thin layer at the interface of the sacrificial layer(s) or combinations thereof. These interface modification treatments do not necessarily need to be performed in-situ with deposition of the sacrificial layer(s). These treatments can be done for both single layer and multilayer sacrificial stacks. With the right mixture of sacrificial material and thickness combined with the treatment(s) described herein, a single layer of sacrificial layer, properly treated, has been found to be sufficient to provide a solution to the release breakdown and/or release attack problems.

In an aspect of this embodiment, the oxidizing treatment performed at step 235 in the process 200 comprises heat treatment. For example, heat treatment of a molybdenum sacrificial layer has been shown to be effective in preventing damage to the overlying/underlying layer(s) during removal of the sacrificial layer with the release etch at the step 245 in the process 200. In another aspect, the oxidizing treatment performed at step 235 comprises treating a molybdenum sacrificial layer with an oxygen plasma at about 350° C. for about 60 seconds. In both of these aspects, there was substantially no release breakdown or release attack resulting in damage of the lower layers such as the dielectric layer 110. Both aspects exhibited increased etching rates of the oxidized sacrificial layer 145 and/or decreased adhesion between the oxidized sacrificial layer 145 and the surrounding layers.

In some embodiments, the treatment of the sacrificial layer at the step 235 in FIG. 9 comprises selecting oxidizing conditions, for the oxidizing of the sacrificial layer to form the oxidized sacrificial portion at step 235, to provide a surface of the oxidized sacrificial portion (e.g., layer 145) that is smoother than the surface of the sacrificial layer 115 prior to the oxidizing. It has been found that treating the surface of the sacrificial layer 115 to form an oxidized sacrificial layer 145 can reduce the surface roughness of an overlying layer 140 after removal of the oxidized sacrificial layer 145. This smoothing can result in superior optical qualities of the overlying layer 140, thereby improving the quality of optical MEMS devices, such as interferometric modulators, formed using this smoothing treatment.

In optical MEMS devices, such as interferometric modulators, the roughness of the cavity-side surface of the movable reflective layer is very important to the optical performance characteristics of the device. Poor roughness of the movable reflective layer can result in a low contrast ratio between the bright state (e.g., actuated) and the dark state (e.g., non-actuated). This can result in poor display device quality. It has also been found that smoothing treatment can improve the electrical response characteristics (e.g., providing a wider and more consistent hysteresis window).

In an example of utilizing this smoothing treatment in the manufacture of interferometric modulators, the oxidizing treatment comprised a treatment with $N_2O$ on the surface of a molybdenum sacrificial layer 115. It has been found that treating the surface of a molybdenum sacrificial layer 115 to form an oxidized molybdenum sacrificial layer 145 can reduce the surface roughness of an overlying layer 140 after removal of the oxidized molybdenum sacrificial layer 145. In this example, a 300 kw $N_2O$ treatment performed after deposition of the molybdenum sacrificial layer sufficiently smoothed the surface of the oxidized molybdenum layer and resulted in significant improvement of the surface roughness of the overlying optical layer after release of the oxidized molybdenum (e.g., using $XeF_2$ etching).

Tests have shown that this 300 kw $N_2O$ treatment resulted in the surface roughness being improved over 70%. Specifically, tests have shown that without the $N_2O$ treatment, an Rms (Rq) surface roughness of 7.321 nm was observed. With the $N_2O$ treatment, the Rms (r1) surface roughness was reduced to 2.221 nm n.

In addition, these tests have shown that this 300 kw $N_2O$ treatment resulted in larger and more consistent hysteresis windows for the display devices. A larger hysteresis window (the width of the hysteresis or stability window centered about $+V_{bias}$ or $-V_{bias}$ in FIG. 3) is desirable because it can improve the reliability of the interferometric modulators in terms of actuation and release voltage levels. In addition, sets of display panels manufactured on a wafer substrate exhibited more uniform or consistent hysteresis window width.

A set of display arrays comprising interferometric modulators exhibited average hysteresis window widths in a range from about 0.5 volts to about 2.0 volts (with an average of about 0.93 volts) when manufactured without the $N_2O$ treatment. With the $N_2O$ treatment, a set of display arrays exhibited hysteresis window widths in a range from about 2.8 volts to about 3.3 volts (with an average of about 3.1 volts). Thus, the average hysteresis window more than tripled in width and the variation among the display devices on the wafer substrate was much smaller.

Further, the display devices that were treated with the $N_2O$ also exhibited higher contrast ratios, for light reflected in the bright state versus the dark state. The set of untreated display arrays exhibited contrast ratios in a range from about 1.6 to about 7.8 with an average of about 4.1. The set of display arrays treated with the $N_2O$ exhibited contrast ratios in a range from about 5.2 to 11.5 with an average of about 10.0. Thus, the average contrast ratio of the $N_2O$ treated display arrays was more than double that of the untreated display arrays.

Such improvements in surface roughness, contrast ratio and hysteresis window width can all improve the performance of the resulting display devices. In addition, the improved uniformity of display devices manufactured on the same wafer substrate using the $N_2O$ treatment can also improve the acceptance yield of the manufactured display devices.

In some embodiments, the treatment at step 235 is performed to solve problems specific to using molybdenum as the sacrificial layer 114. However, the treatment of these embodiments can be used for other sacrificial layers as well, such as, tantalum or tungsten sacrificial layers. Two problems have been found to occur when using molybdenum as the sacrificial layer. A first problem involves impurities left behind after removal of the sacrificial layer at the step 245 in the process 200. These impurities are known as worm residue. Worm residue can degrade the optical qualities of the cavity of the interferometric modulator. A second problem has to do with pin-holes (i.e., small voids) that are formed in the sacrificial layer during the deposition of the sacrificial layer at step 220 in the process 200. These pin-holes can result in electrical leakage, e.g., between the row and column electrodes, in MEMS devices such as interferometric modulators. This electrical leakage between row and column electrodes is known as RC leakage. The pin-holes can cause RC leakage in two ways. First, the etchant used to etch the support structure apertures at the step 225, may penetrate through the pin-holes in the sacrificial layer and damage the underlying optical layers of the optical stack and cause shorts between the electrically conductive layers. Second, the overlying layer deposited over the sacrificial layer can fill the pin-holes and result in a rough reflective surface on the overlying layer after the sacrificial layer is removed.

It has been found that both the RC leakage and pin-hole problems associated with molybdenum can be reduced by performing some embodiments of the treatment of the sacrificial layer at the step 235 in FIG. 9. These embodiments comprise selecting a treatment, such as an oxidizing, chlorinating, fluorinating, nitrating and/or nitriding treatment, and selecting treatment conditions that increase a combined thickness of the upper treated sacrificial layer (layer 145) and the lower substantially untreated sacrificial layer (layer 115), as compared to the sacrificial layer 115 prior to the treating.

In one aspect, expanding the volume of the sacrificial layer by a treatment offers a way to increase the thicknesses of the sacrificial layer to a second thickness after formation of a sacrificial layer (e.g., molybdenum, tantalum or tungsten) with a first thickness. Thus, less sacrificial material is required to form a sacrificial layer of the second thickness. Since less sacrificial material is used, less worm residue can result from removal of the sacrificial layer. In addition, depending on the sacrificial material, the treated sacrificial material may also etch more cleanly than the untreated sacrificial material and also result in less worm residue.

In another aspect, expansion of the volume of the sacrificial layer can reduce or eliminate the pin-holes that have been found to form in the sacrificial layer, e.g., when using Molybdenum as the sacrificial layer. The pin-holes in the sacrificial (e.g., molybdenum) layer can be closed due to lateral expansion of the sacrificial layer during the oxidation treatment.

In embodiments where molybdenum is used as the sacrificial layer and oxidizing is used as the treatment, the treatment at step 235 results in a molybdenum oxide layer 145 being formed on at least the surface of the unoxidized molybdenum sacrificial layer 115. Depending on the amount of oxidation, and the nature of the oxidation treatment, different molybdenum oxides can be formed. It has been found that the most stable molybdenum oxide tends to be $MoO_3$. Given that the density of molybdenum is about 10.3 kg/cm$^3$ and that the density of $MoO_3$ is about 4.7 kg/cm$^3$, the molybdenum sacrificial layer will undergo expansion in volume during oxidation. Thus, for example, in a constrained embodiment in which the molybdenum can only expand in one direction (e.g., perpendicular to the substrate), the thickness of the $MoO_3$ layer could be as much as 3.3 times that of the unoxidized molybdenum layer before oxidation.

In some embodiments, a passivation layer is formed over the molybdenum oxide layer. For example, $SiO_2$ can be deposited prior to deposition of the overlying layer 140 formed at step 240 in the process 200. The overlying layer 140 can further include a second electrically conductive layer formed over the passivation layer. The passivation layer serves to aid in the oxidized sacrificial layer 145 separating from the second electrically conductive layer during removal of the oxidized sacrificial layer 145 at the step 245. In these embodiments, the oxidizing treatment of the step 235 can comprise treatment with gasses such as $Cl_2$, $Fl_2$, $O_2$ and/or $N_2O$ and others.

Experiments have been done to verify that oxidation of molybdenum results is expansion of the sacrificial layer in a way that it fills small voids such as the small pin-holes as well as expanding in a direction vertical to the substrate to a depth sufficient to define the depth of an interferometric cavity.

Figure 11:
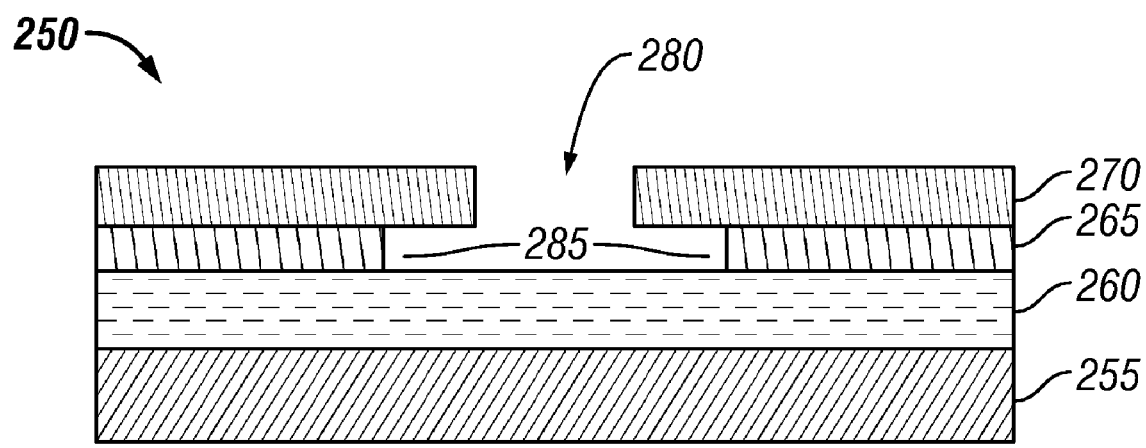
FIG. 11 illustrates an example of a multilayered stack used in experiments to verify expansion characteristics of molybdenum treated by oxidation.

FIG. 11 illustrates an example of a multilayered stack used in experiments to verify expansion characteristics of molybdenum treated by oxidation. A multilayered stack 250 is formed on a silicon substrate 255. A first layer of molybdenum 260 is deposited on the silicon substrate 255. A layer of $SiO_2$ 265 is then deposited over the first molybdenum layer 260. A second layer of molybdenum 270 is then deposited over the $SiO_2$ layer 265. In the embodiment shown in FIG. 11, the first and second molybdenum layers 260 and 270 are each 2000' in depth and the $SiO_2$ layer 265 is 450' in depth (as measured perpendicular to the substrate 255).

After formation of the second molybdenum layer 270, a hole 280 is patterned in the molybdenum layer 270. After formation of the hole 280, the $SiO_2$ layer 265 is etched so as to undercut the second molybdenum layer 270, thereby forming small cavities 285 between the first molybdenum layer 260 and the second molybdenum layer 270. The lateral dimensions of the cavities 285 are about 6000'.

After formation of the cavities 285, the multilayered stack 250 is placed in a CVD chamber and subjected to oxidation. The particular oxidation used in these experiments was an oxygen plasma oxidation process. However, other oxidation processes, such as thermal oxidation, although in some cases less preferred due to higher possible temperatures, may also be used. After approximately 180 seconds of oxidation in the CVD chamber, the cavities 285 are substantially closed due to oxidation and resulting expansion of the first and second molybdenum layers 260 and 270. Thus, the experiment verifies that oxidation of molybdenum can be a viable solution to filling small voids such as the pin-holes as discussed above.

Treatments other than oxidation can also effectively expand the sacrificial layer. Table 1 indicates how fluorination, nitration, chlorination and oxidization affect the volume of molybdenum, silicon, tungsten, and germanium. After treating with fluorine, nitrogen, silicon, chlorine or oxygen, the volume of the molybdenum, as shown in Table 1 below, is increased as compared to the untreated condition (compare the molar volume of $MoF_3$, $MoF_5$, $MoN$, $MoSi_2$, $MoO_2$, $MoO_3$ and $MoCl_3$ to that of Mo in Table 1). Similarly, the molar volume of silicon nitride and silicon oxide is greater than that of silicon; the molar volume of germanium fluoride is greater than that of germanium; and the molar volume of tungsten nitride, tungsten chloride, and tungsten oxide is greater than that of tungsten. These analyses indicate that treatment of the sacrificial layer with fluorine, nitrogen, silicon, chlorine and/or oxygen can effectively expand the sacrificial layer. Thus, less of these sacrificial materials can be used to provide a given sacrificial layer thickness, thereby saving costs and improving the efficiency of the manufacturing process.

TABLE 1

| Material | Molar volume ($cm^3$/mol) | $XeF_2$ stoichiometry | $XeF_2$ usage vs. Mo |
|---|---|---|---|
| Mo | 9.5 | 3 | 1 |
| Si | 12.1 | 2 | 0.53 |
| W | 9.4 | 3 | 1.0 |
| Ge | 13.6 | 2 | 0.47 |
| $MoF_3$ | 33.0 | 1.5 | 0.14 |
| $MoF_5$ | 54.6 | 0.5 | 0.029 |
| MoN | 12.0 | 3 | 0.80 |
| $MoSi_2$ | 24.5 | 7 | 0.91 |
| $MoO_2$ | 19.8 | 2 | 0.32 |
| $MoO_3$ | 30.6 | 2 | 0.21 |
| $MoCl_3$ | 54.1 | 3 | 0.18 |
| $WN_2$ | 27.5 | 3 | 0.35 |
| $WCl_4$ | 70.5 | 3 | 0.14 |
| $WO_2$ | 20.0 | 3 | 0.48 |
| SIO | 20.2 | 2 | 0.31 |
| $SI_3N_4$ | 44.3 | 6 | 0.43 |
| $GeF_2$ | 30.4 | 1 | 0.10 |

Table 1 also lists a ratio of the stoichiometric amount of the $XeF_2$ needed to etch the sacrificial material (both untreated materials and treated materials) compared to the amount needed to etch untreated Mo. As can be seen, nearly all the treated materials require less $XeF_2$ to be etched than untreated Mo. By using less $XeF_2$ costs can be reduced and efficiency of the manufacturing process can be improved.

While the above detailed description has shown, described, and pointed out novel features as applied to various embodiments, it will be understood that various omissions, substitutions, and changes in the form and details of the device or process illustrated may be made without departing from that which has been disclosed. As will be recognized, the present invention may be embodied within a form that does not provide all of the features and benefits set forth herein, as some features may be used or practiced separately from others.

What is claimed is:

1. A method of making a microelectromechanical system (MEMS) device, comprising:
   forming a sacrificial layer over a substrate;
   treating at least a portion of the sacrificial layer to form a treated sacrificial portion, wherein a substantial portion of the sacrificial layer remains after the treating and, wherein the treated sacrificial portion comprises an upper treated sacrificial layer, and a remaining portion of the sacrificial layer comprises a lower substantially untreated sacrificial layer;
   forming an overlying layer over at least a part of the treated sacrificial portion; and
   at least partially removing the treated sacrificial portion to form a cavity situated between the substrate and the overlying layer, the overlying layer being exposed to the cavity.

2. The method of claim 1, wherein the treating comprises oxidizing.

3. The method of claim 1, wherein the treating comprises exposing the sacrificial layer to one or more of nitrogen, fluorine, and chlorine.

4. The method of claim 1, wherein the cavity is an interferometric modulation cavity.

5. The method of claim 1, wherein the upper treated sacrificial layer is substantially uniform in depth as measured in a direction perpendicular to the substrate.

6. The method of claim 1, comprising removing at least a portion of the upper treated sacrificial layer and at least a portion of the lower substantially untreated sacrificial layer, wherein an etch rate of the upper treated sacrificial layer is greater than an etch rate of the lower substantially untreated sacrificial layer.

7. The method of claim 1, wherein the lower substantially untreated sacrificial layer comprises molybdenum.

8. The method of claim 7, wherein the upper treated sacrificial layer comprises a molybdenum oxide.

9. The method of claim 1, wherein the overlying layer comprises a metal.

10. The method of claim 9, wherein the metal comprises aluminum.

11. The method of claim 10, comprising selecting treatment conditions, for the treating of the sacrificial layer to form the treated sacrificial portion, to reduce hillock formation in the overlying aluminum layer subsequent to the at least partial removal of the treated sacrificial portion, the method further comprising exposing the MEMS device to an otherwise hillock-inducing condition subsequent to the at least partial removal of the treated sacrificial portion.

12. The method of claim 11, comprising selecting the treatment conditions to reduce the number of the hillocks.

13. The method of claim 11, comprising selecting the treatment conditions to reduce the size of the hillocks.

14. The method of claim 11, wherein the hillocks comprise heat-induced hillocks.

15. The method of claim 11, wherein the otherwise hillock-inducing condition comprises exposing the MEMS device to a temperature greater than about 100° C.

16. The method of claim 11, wherein the otherwise hillock-inducing condition comprises exposing the MEMS device to a temperature greater than about 200° C.

17. The method of claim 11, wherein the otherwise hillock-inducing condition comprises exposing the MEMS device to a temperature greater than about 500° C.

18. The method of claim 1, comprising selecting treatment conditions, for the treating of the sacrificial layer to form the treated sacrificial portion, to increase a combined thickness of the upper treated sacrificial layer and the lower substantially untreated sacrificial layer, as compared to the sacrificial layer prior to the treating.

19. The method of claim 1, comprising selecting treatment conditions, for the treating of the sacrificial layer to form the treated sacrificial portion, to decrease the degree of adhesion between the overlying layer and the treated sacrificial portion during the at least partial removal of the treated sacrificial portion.

20. The method of claim 1, wherein the overlying layer comprises a passivation layer and an electrically conductive layer formed over the passivation layer, the passivation layer being configured to aid in allowing the treated sacrificial portion to separate from the electrically conductive layer during the at least partial removal of the treated sacrificial portion.

21. The method of claim 1, comprising selecting treatment conditions, for the treating of the sacrificial layer to form the treated sacrificial portion, to provide a surface of the treated sacrificial portion that is smoother than the surface of the sacrificial layer prior to the treatment.

22. The method of claim 21, wherein the treatment conditions comprise an $N_2O$ or $O_2$ treatment, or both.

23. The method of claim 1, wherein the treating of the at least a portion of the sacrificial layer comprises exposing a surface of the sacrificial layer to oxygen-containing molecules or radicals.

24. The method of claim 23, wherein the oxygen comprises ionized oxygen.

25. The method of claim 1, wherein the treating of the at least a portion of the sacrificial layer comprises heating the sacrificial layer.

26. The method of claim 1, wherein the treating of the at least a portion of the sacrificial layer comprises exposing the sacrificial layer to a plasma.

27. The method of claim 1, comprising removing substantially all of the treated sacrificial portion.

28. The method of claim 1, further comprising:
treating a surface of the sacrificial layer by exposing the surface of the sacrificial layer to sulfur hexafluoride; and
forming the overlying layer over the sulfur hexafluoride-treated surface.

29. The method of claim 1, further comprising:
forming an electrode over the substrate; and
forming the sacrificial layer over the electrode,
wherein the cavity is situated between the electrode and the overlying layer.

30. The method of claim 29, further comprising forming an insulating layer over the electrode.

31. The method of claim 29, further comprising forming at least one support structure that separates the electrode and the overlying layer.

32. The method of claim 1 wherein said treating comprises exposing said at least a portion of the sacrificial layer to at least one selected from the group consisting of oxygen, nitrogen, fluorine, chlorine, silicon, sulfur hexafluoride, plasma, $H_2O$, and heat.

* * * * *